(12) United States Patent
Heiman et al.

(10) Patent No.: US 7,834,287 B2
(45) Date of Patent: Nov. 16, 2010

(54) CAPACITIVE TOUCH SWITCH

(75) Inventors: Uwe Heiman, Nürnberg (DE); Michael Prinz, Leutkirch (DE)

(73) Assignee: Diehl AKO Stiftung & Co. KG, Wangen (DE)

( * ) Notice: Subject to any disclaimer, the term of this patent is extended or adjusted under 35 U.S.C. 154(b) by 1052 days.

(21) Appl. No.: 11/590,035

(22) Filed: Oct. 30, 2006

(65) Prior Publication Data

US 2007/0103451 A1    May 10, 2007

(30) Foreign Application Priority Data

Nov. 9, 2005    (DE) .................. 10 2005 053 792

(51) Int. Cl.
*H03K 17/975*    (2006.01)

(52) U.S. Cl. .................................... 200/600

(58) Field of Classification Search ............... 200/5 A, 200/600, 511, 512; 341/22, 33, 34; 345/168, 345/169, 173; 178/18.06
See application file for complete search history.

(56) References Cited

U.S. PATENT DOCUMENTS

| | | | |
|---|---|---|---|
| 3,701,869 A | | 10/1972 | Jacob et al. |
| 3,908,100 A | * | 9/1975 | Richard et al. ............... 200/5 A |
| 4,085,394 A | | 4/1978 | Weisenburger |
| 5,892,652 A | | 4/1999 | Bony et al. |
| 5,917,165 A | * | 6/1999 | Platt et al. .................... 200/600 |
| 6,667,563 B2 | * | 12/2003 | Bae et al. ..................... 307/112 |
| 7,232,973 B2 | * | 6/2007 | Kaps et al. ................... 200/600 |
| 7,511,242 B2 | * | 3/2009 | Winkler ....................... 200/600 |
| 7,515,140 B2 | * | 4/2009 | Philipp ......................... 345/173 |
| 7,525,062 B2 | * | 4/2009 | Adam et al. .................. 200/600 |
| 7,579,569 B2 | * | 8/2009 | Romanowski ............... 200/600 |
| 7,652,220 B2 | * | 1/2010 | Weiss .......................... 200/600 |
| 2005/0179673 A1 | | 8/2005 | Philipp |

FOREIGN PATENT DOCUMENTS

| | | |
|---|---|---|
| DE | 32 45 803 A1 | 6/1984 |
| DE | 20 2005 002 157 U1 | 5/2005 |
| DE | 103 52 681 A1 | 6/2005 |
| DE | 10 2004 019 304 A1 | 11/2005 |
| DE | 10 2005 041 111 A1 | 3/2007 |
| EP | 0 858 166 A1 | 8/1998 |
| EP | 0 866 388 A1 | 9/1998 |
| FR | 2 704 332 | 10/1994 |
| WO | 2005/043760 A1 | 5/2005 |
| WO | 2005/101663 A1 | 10/2005 |
| WO | 2007/025867 A1 | 3/2007 |

* cited by examiner

*Primary Examiner*—Michael A Friedhofer
(74) *Attorney, Agent, or Firm*—Laurence A. Greenberg; Werner H. Stemer; Ralph E. Locher

(57) ABSTRACT

A capacitive touch switch, for a control panel of a domestic electrical appliance, includes a touch panel having an upper side and an underside. A printed circuit board is disposed at a distance below the underside of the touch panel. A sensor element is disposed between the underside of the touch panel and the printed circuit board and is in electrically conductive contact with the printed circuit board. The capacitive sensor element has a compression spring formed of an electrically conductive material and a contact element formed of an electrically conductive material, which is disposed on that side of the compression spring which faces the touch panel and which is in electrically conductive contact with the compression spring.

20 Claims, 3 Drawing Sheets

CAPACITIVE TOUCH SWITCH

CROSS-REFERENCE TO RELATED APPLICATION

This application claims the priority, under 35 U.S.C. §119, of German Patent Application DE 10 2005 053 792.8, filed Nov. 9, 2005; the prior application is herewith incorporated by reference in its entirety.

BACKGROUND OF THE INVENTION

Field of the Invention

The present invention relates to a capacitive touch switch having a touch panel with an upper side and an underside, a printed circuit board which is disposed at a distance beneath the underside of the touch panel, and a capacitive sensor element which is disposed between the underside of the touch panel and the printed circuit board and is in electrically conductive contact with the printed circuit board.

Touch switches which trigger a certain switching operation simply by a user touching them are used ever more frequently in many electrical appliances, in particular even in domestic appliances such as cookers, cook tops, microwave ovens, dishwashers, washing machines or the like. In the case of a capacitive touch switch, a capacitive sensor element together with the finger of a user acting through a touch panel as a dielectric forms a capacitance which is variable corresponding to the actuation of the touch switch, i.e. a touch panel associated with the capacitive sensor element being touched or not being touched. The change in capacitance of the capacitive sensor element occurring due to it being touched by the user has a corresponding effect on an output signal from the sensor circuit, which is correspondingly evaluated by a connected evaluation circuit as an actuation of the capacitive touch switch. Such a capacitive touch switch is known, for example, from German Published, Non-Prosecuted Patent Application DE 32 45 803 A1.

In addition, German Utility Model DE 20 2005 002 157 U1 discloses a capacitive sensor element for a touch switch of the above-described type, which is formed from an electrically conductive compression spring that is wider at the end facing the touch panel. The compression spring is mechanically and electrically connected to a printed circuit board, for example by soldering. Such a capacitive sensor element, on one hand, ensures good contact between the sensor element and the touch panel and, on the other hand, offers an extended sensitive area. One disadvantage with that capacitive sensor element, however, is its complicated form due to the extended area.

U.S. Pat. No. 5,917,165 describes a sensor element for a capacitive touch switch, which is formed from an electrically conductive, elastic foam, plastic or rubber body. Such a sensor element is distinguished by its simple construction and simple assembly and also ensures good electrical contact with both the printed circuit board and the touch panel.

SUMMARY OF THE INVENTION

It is accordingly an object of the invention to provide a capacitive touch switch, which overcomes the hereinafore-mentioned disadvantages of the heretofore-known devices of this general type, which ensures good electrical contact with a touch panel even in the event of fluctuating temperatures and which can be used variably despite its simple construction.

With the foregoing and other objects in view there is provided, in accordance with the invention, a capacitive touch switch. The capacitive touch switch comprises a touch panel having an upper side and an underside. A printed circuit board is disposed at a distance below the underside of the touch panel. A capacitive sensor element is disposed between the underside of the touch panel and the printed circuit board. The capacitive sensor element is in electrically conductive contact with the printed circuit board. The capacitive sensor element has a compression spring formed of an electrically conductive material and a contact element formed of an electrically conductive material. The compression spring has a side facing the touch panel. The contact element is disposed on the side of the compression spring facing the touch panel, and the contact element is in electrically conductive contact with the compression spring.

The contact element can be matched variably to both the shape and the structure of the touch panel and to the shape and size of the sensitive area available to the user. Due to the two-part construction of the sensor element, such matching is possible without any problems and without a single component being overloaded with features or functions. In this case, the contact element can also form a relatively large sensitive area without metal platings of the touch panel being necessary for this purpose. The compression spring, which is supported against the printed circuit board and the contact element, ensures reliable contact between the contact element of the sensor element and the underside of the touch panel, as a result of which the functionality of the capacitive touch switch is improved even in the event of changes in temperature, aging processes of the components, tolerances and positional inaccuracies of the components or the like.

In accordance with another feature of the invention, the capacitive touch switch also has a central holding pin, which extends through the sensor element substantially over its entire height. The compression spring and the contact element can be pushed or plugged onto this holding pin and thus positioned in a simple manner between the printed circuit board and the touch panel.

In accordance with a further feature of the invention, the holding pin can be provided, at its end facing the printed circuit board, with a latching device for mechanical connection to the printed circuit board. Alternatively, the holding pin can also be constructed to be integral or in one piece with the touch panel.

In accordance with an added feature of the invention, the capacitive sensor element also has, on its side facing the printed circuit board, a further contact element for the purpose of making electrical contact with the printed circuit board.

In accordance with an additional feature of the invention, the further contact element can be provided with a latching device for the mechanical connection to the printed circuit board. Furthermore, this further contact element and the compression spring can be connected to one another through the use of a soldered joint.

In accordance with yet another feature of the invention, a further contact element is provided on the printed circuit board for the purpose of making electrical contact with the compression spring. The compression spring is supported on the further contact element.

In accordance with yet a further feature of the invention, the contact element and the compression spring of the sensor element are connected to one another through the use of a soldered joint.

In accordance with yet an added feature of the invention, the holding pin is in the form of a fiber-optic element, and a luminous element, such as, for example, an LED, is disposed on the printed circuit board in a central position of the sensor element, with the result that the touch panel can be back-lit for the user.

In accordance with yet an additional feature of the invention, in one alternative embodiment without a holding pin, a luminous element is disposed on the printed circuit board in a central position of the sensor element. It is also possible for a central fiber-optic element to be associated with the luminous element. The fiber-optic element extends through the sensor element substantially over its entire height.

In accordance with again another feature of the invention, the touch switch also has at least one luminous element, in addition to the capacitive sensor element, between the printed circuit board and the touch panel, in order to back-light the touch panel over a large area.

In accordance with again a further feature of the invention, the touch panel can be provided on its upper side with a foil, which is metal-plated on its rear side facing the touch panel in the region of the contact element of the capacitive sensor element. Instead of the foil, a metal-plated color imprint can advantageously be used.

In accordance with again an added feature of the invention, the touch panel can be provided on its underside with a foil, which is metal-plated on its rear side facing the touch panel in the region of the contact element of the capacitive sensor element. Instead of the foil, a metal-plated color imprint can advantageously be used.

In accordance with a concomitant feature of the invention, the foil or the color imprint disposed on the underside of the touch panel is in contact with a further plate, which may be formed of a different material from the touch panel.

Other features which are considered as characteristic for the invention are set forth in the appended claims.

Although the invention is illustrated and described herein as embodied in a capacitive touch switch, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
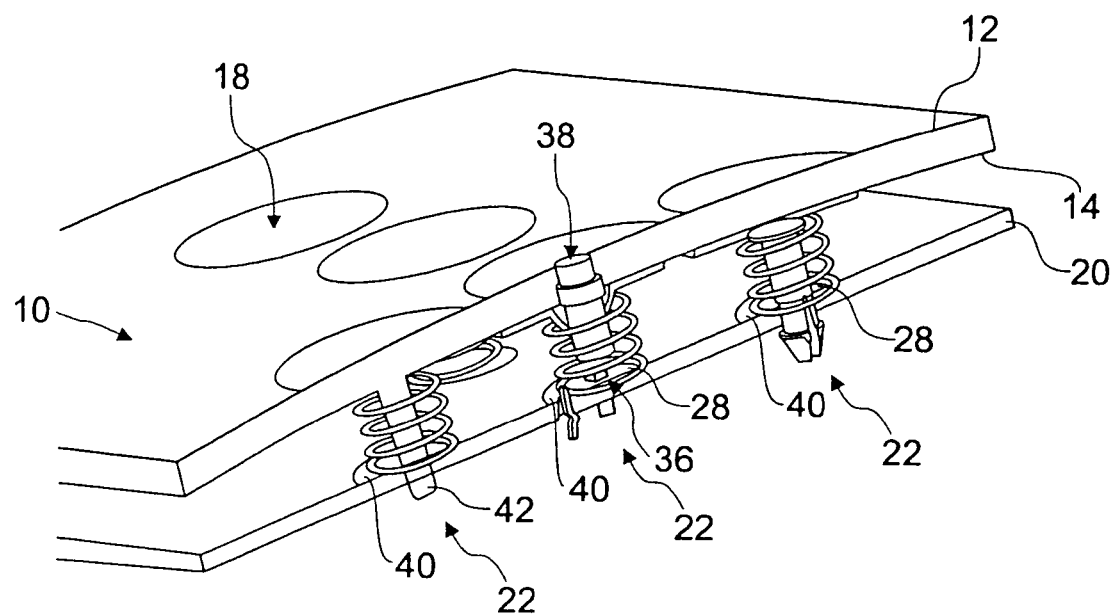
FIG. 1 is a fragmentary, diagrammatic, perspective view of a cut-open control panel having a plurality of different capacitive touch switches in accordance with the present invention.

Referring now to the figures of the drawings in detail and first, particularly, to FIG. 1 thereof, there is seen a diagrammatic, perspective view of a portion of a control panel of an electrical appliance, in particular a domestic electrical appliance (cooker, cook top, microwave oven, dishwasher, washing machine or the like).

Reference numeral 10 denotes a touch panel such as, for example, a plastic plate or a glass ceramic plate of a cook top, which has an upper side 12 and an underside 14. A foil 16 (see FIG. 5) is applied to the upper side 12 of the touch panel 10, for example through the use of IMD or IML technology. The foil 16 is provided, for example, with a (preferably metal-plated) color imprint for the purpose of distinguishing different sensitive areas 18 of individual touch switches. A metal-plated imprint can also be used instead of the foil.

However, a foil 16 (see FIG. 5) or a metal-plated color imprint can also be applied to the underside 14 of the touch panel 10, for example through the use of IMD or IML technology, in order to distinguish the various sensitive areas 18 of the individual touch switches.

A printed circuit board 20 is disposed at a certain distance from the underside 14 of the touch panel 10. The printed circuit board 20 is fitted with various non-illustrated electrical components and in particular contains a sensor circuit and an evaluation circuit for the various capacitive touch switches.

The illustration in FIG. 1 shows a total of three different capacitive touch switches 22 in accordance with first, second and third exemplary embodiments having correspondingly different sensor elements, which will be explained in more detail below with reference to FIGS. 2 to 4.

Figure 2:
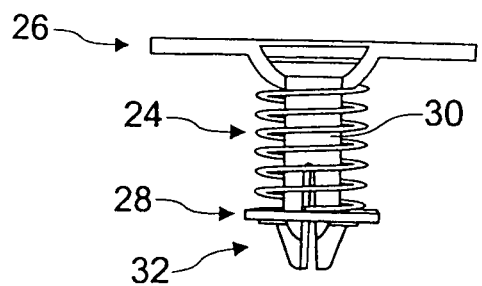
FIG. 2 is a side-elevational view of a sensor element of a capacitive touch switch in accordance with a first exemplary embodiment of the present invention.

The capacitive touch switch 22 (without the touch panel 10 and the printed circuit board 20) illustrated in FIG. 2, in accordance with the first exemplary embodiment, corresponds to the embodiment on the right-hand side of FIG. 1.

The capacitive sensor element of this touch switch 22 substantially includes a compression spring 24 being formed of an electrically conductive material, a contact element 26, which is disposed on that side of the compression spring 24 which faces the touch panel 10 (at the top in FIG. 2) and is formed of an electrically conductive material, and a further contact element 28, which is disposed on that side of the compression spring 24 which faces the printed circuit board 20 (at the bottom in FIG. 2) and is formed of an electrically conductive material. The contact element 26 and the further contact element 28 are each in electrically conductive contact with the compression spring 24, which is supported against these two contact elements 26, 28.

The capacitive touch switch 22 in this exemplary embodiment also contains a central holding pin 30, for example being formed of plastic, which extends substantially over the entire height of the sensor element, and a latching device 32 provided at that end of the central holding pin which faces the printed circuit board 20 (at the bottom in FIG. 2) or is formed integrally therewith. The latching device 32 is, for example, in the form of an extended tip having a central cutout, as a result of which the latching device 32 can be pushed through a corresponding mounting hole in the printed circuit board 20 and clamped fixedly there, as is shown in FIG. 1.

The central holding pin 30 is used for positioning the sensor element of the capacitive touch switch 22 on the printed circuit board 20. For mounting purposes, either the sensor element including the compression spring 24, the contact element 26 and the further contact element 28 can be placed onto the holding pin 30 and then this preassembled assembly can be mounted on the printed circuit board 20, or the holding pin 30 can first be mounted on the printed circuit board 20 and then fitted with the sensor element including the compression spring 24, the contact element 26 and the further contact element 28. In any case, the capacitive touch switch 22 allows for a simple mounting process.

The two contact elements 26 and 28 are each illustrated in the form of discs in FIG. 2. The present invention is, however, not restricted to any particular shape and size of these contact elements 26, 28. In particular, the contact element 26 for the touch panel 10 can be matched in terms of its shape and size to the desired sensitive area 18 and in terms of its shape and structure to the underside 14 of the touch panel 10. The contour of the contact element 26 may therefore be, for example, circular, elliptical, square, rectangular, reniform, etc. The corresponding sensitive area 18 of the capacitive touch switch 22 is indicated to the user, for example, by a color imprint on the foil 16, as has already been mentioned above. Even raised or depressed areas of the underside 14 of the touch panel 10 can be adapted without any problems through the use of a corresponding contact element 26.

In the mounted state, as is shown on the right-hand side in FIG. 1, the sensor element including the compression spring 24, the contact element 26 and the further contact element 28 of the capacitive touch switch 22 is disposed between the underside 14 of the touch panel 10 and the printed circuit board 20 and is fixed in its position through the use of the holding pin 30. The compression spring 24 on one hand presses the contact element 26 against the underside 14 of the touch panel 10 and, on the other hand, presses the further contact element 28 against a corresponding electrical contact 40 on the printed circuit board 20. As a result, sufficiently good contact with the sensor element is always ensured irrespective of temperature fluctuations, component tolerances, positional inaccuracies or the like. Therefore, the functionality of the capacitive touch switch 22 is ensured.

While the compression spring 24, the contact element 26 and the further contact element 28 are placed loosely onto the holding pin 30 in the above-described first exemplary embodiment, it is also possible for the compression spring 24 and the contact element 26 and/or the compression spring 24 and the further contact element 28 to be connected to one another electrically and mechanically through the use of a soldered joint.

A second exemplary embodiment of a capacitive touch switch 22 of the invention will now be explained in more detail with reference to FIGS. 1 and 3.

Figure 3:
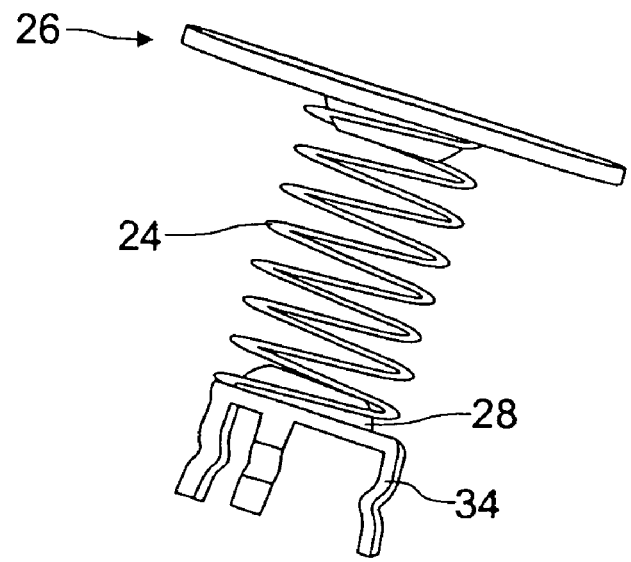
FIG. 3 is a side-elevational view of a sensor element of a capacitive touch switch in accordance with a second exemplary embodiment of the present invention.

As is shown in FIG. 3, the sensor element of this capacitive touch switch 22 includes a compression spring 24 being formed of an electrically conductive material, a contact element 26, which is provided on that side of the compression spring 24 which faces the touch panel 10 and is formed of an electrically conductive material, and a further contact element 28, which is provided on that side of the compression spring 24 which faces the printed circuit board 20 and is formed of an electrically conductive material. The further contact element 28 also has a latching device 34, for example in the form of spring legs, which can be plugged through corresponding mounting holes in the printed circuit board 20 and fixedly clamped, as is illustrated in the center of FIG. 1.

Since, in this exemplary embodiment shown in FIG. 3 and in the center of FIG. 1, no central holding pin 30 is provided for positioning the sensor element, in contrast to the above-described first exemplary embodiment, it is preferable to solder the compression spring 24 and the contact element 26 and the compression spring 24 and the further contact element 28 to one another in each case. In addition, the latching device 34 of the further contact element 28 is preferably soldered to a corresponding electrical contact on the printed circuit board 20.

The remaining elements and their functions and advantages correspond to those of the first exemplary embodiment. In particular, the statements made above in connection with the exemplary embodiment in FIG. 2 apply with regard to the embodiments of the contact element 26. In addition, the same effects and advantages are achieved with the capacitive touch switch 22 in the center of FIG. 1 and in FIG. 3 as in the above-described first exemplary embodiment.

As is illustrated in the center of FIG. 1, in this case the capacitive touch switch 22 can also have a luminous element 36, for example in the form of a light-emitting diode (LED), which is fitted centrally with respect to the sensor element 24-28 on the printed circuit board 20. The sensitive area 18 of this capacitive touch switch 22 can be back-lit for the user in a simple manner by using this LED 36. In order to improve the efficiency of the LED 36 with respect to the back-lighting of the sensitive area 18, it is advantageous if the capacitive touch switch 22 also has a central fiber-optic element 38, which extends through the sensor element 24-28 substantially over its entire height and possibly as far as into the underside 14 of the touch panel 10.

A third exemplary embodiment of the capacitive touch switch 22 will now be explained in more detail with reference to FIG. 4 and the left-hand side of FIG. 1.

Figure 4:
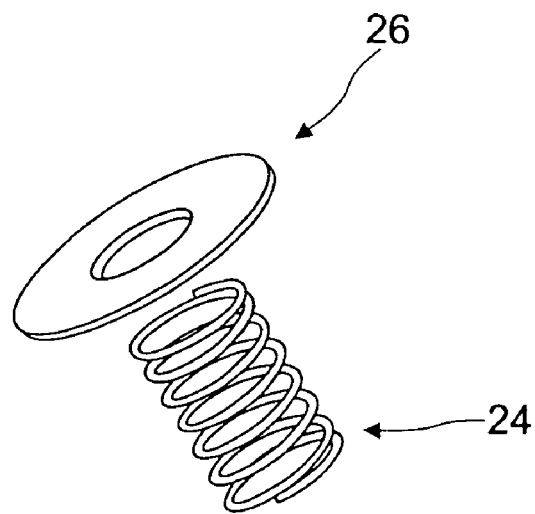
FIG. 4 is a perspective view of a sensor element of a capacitive touch switch in accordance with a third exemplary embodiment of the present invention.

The capacitive touch switch 22 of FIG. 4 has a sensor element including a compression spring 24 being formed of an electrically conductive material and a contact element 26 being formed of an electrically conductive material, which is disposed on that side of the compression spring 24 which faces the touch panel 10. In contrast to the two above-described exemplary embodiments, the sensor element of this capacitive touch switch 22 does not have a further contact element 28 on that side of the compression spring 24 which faces the printed circuit board 20. Instead, the printed circuit board 20 itself is provided with a further contact element 40 in the form of an electrical contact face, as is illustrated on the left-hand side of FIG. 1. In this case, the compression spring 24 is supported against the contact element 26 and against the further contact element 40 on the printed circuit board 20.

As can be seen on the left-hand side of FIG. 1, a central holding pin 42, for example being formed of plastic or glass ceramic, is also provided. The central holding pin 42 is formed integrally or in one-piece with the touch panel 10 and extends over the entire height of the sensor element 24-26 as far as through a corresponding mounting hole in the printed circuit board 20, in order to be able to position the sensor element 24-26 precisely between the printed circuit board 20 and the touch panel 10. A latching device similar to the first exemplary embodiment is not provided on the central holding pin 42 in this case, but may optionally likewise be provided.

Further components, features, their effects and advantages are the same as those for the above-described first exemplary embodiment. In particular, it is also possible in this case for the compression spring 24 and the contact element 26 to be placed individually and loosely onto the central holding pin 42 or for the compression spring 24 and the contact element 26 to be soldered to one another and to be placed onto the central holding pin 42 as one unit.

Furthermore, a combination of the first and third exemplary embodiments of FIGS. 2 and 4 is also conceivable. That is to say, the capacitive touch switch 22 may contain a sensor element as shown in FIG. 4 with a compression spring 24 and a contact element 26, a further contact element 40 on the printed circuit board 20 as shown in FIG. 4 and a central holding pin 30 as shown in FIG. 2.

In one further alternative of FIG. 4, it is also possible for the central holding pin 42 to be in the form of a fiber-optic element, and for a luminous element, for example in the form of an LED, to be disposed on the printed circuit board 20 in a corresponding position. As a result, the sensitive area 18 of the touch switch 22 can be back-lit on the touch panel 10 for the user in a similar manner to the above-described second exemplary embodiment.

Figure 5:
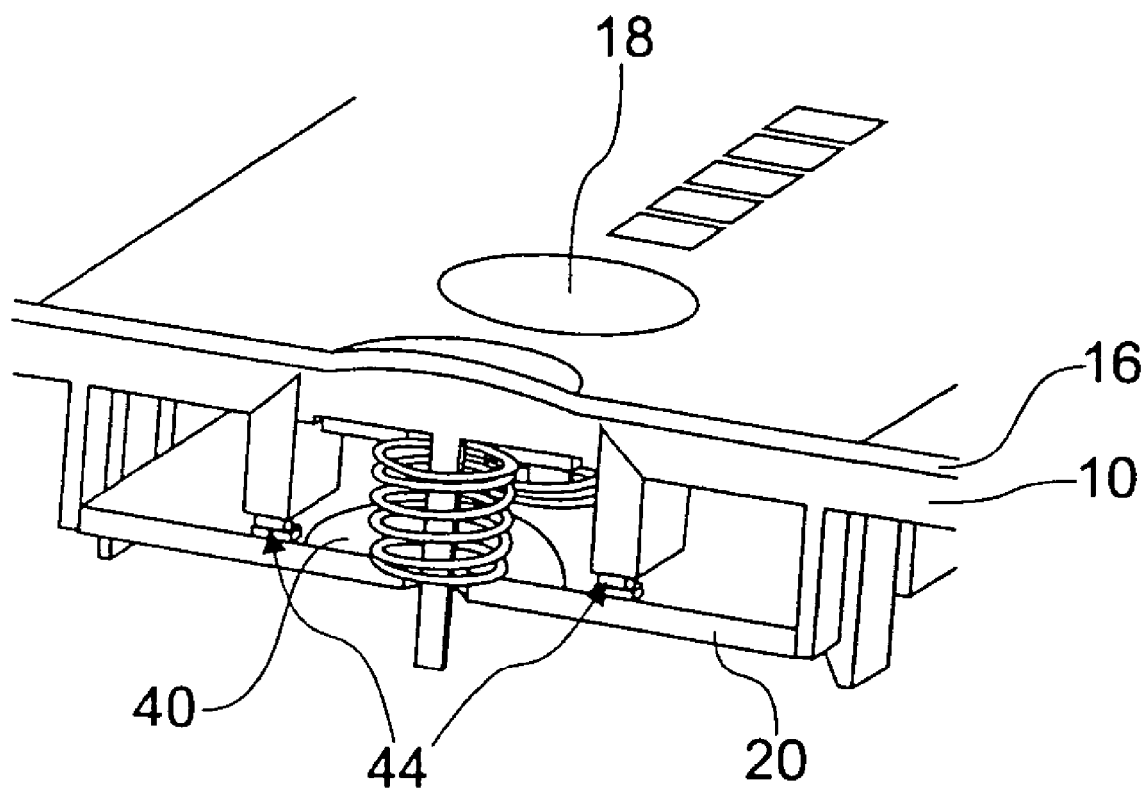
FIG. 5 is a fragmentary, perspective view of a cut-open capacitive touch switch in accordance with a fourth exemplary embodiment of the present invention.

Finally, FIG. 5 shows a diagrammatic illustration of a capacitive touch switch 22 of a further exemplary embodiment.

The touch switch 22 of FIG. 5 has substantially the same construction as that of the third exemplary embodiment in FIG. 4, but the present embodiment can also be transferred in an analogous manner to the other above-described exemplary embodiments.

In addition to the sensor element 24-26, luminous elements 44 including, for example, an LED and a fiber-optic element, are provided on the printed circuit board 20 on two sides. It is thus possible to back-light the sensitive area 18 of the capacitive touch switch 22 on the touch panel 10 over a large area.

The above-described capacitive touch switches 22 illustrated in the figures achieve in particular the following advantages:

- the total sensitive area 18 of the touch panel 10 can be reproduced in terms of its geometric form in a completely contactable manner through the use of a corresponding, congruent contact element 26;
- mechanical contact-making problems between the contact element 26 and the underside 14 of the touch panel 10, such as tolerances, offset, positional inaccuracies, differences in level or the like, can be permanently compensated for;
- the sensor element in its entirety can be fixed to the printed circuit board 20 or mounted in the control panel and held by the printed circuit board 20 by using a simple mounting process;
- a multi-part construction of the sensor element avoids functional overload on the individual component and at the same time allows for optimum matching to specially required tasks; and
- electrically conductive pressure on the operating side of the touch face 10 for the purpose of increasing the sensitive area 18 is not necessary.

We claim:

1. A capacitive touch switch, comprising:
   a touch panel having an upper side and an underside;
   a printed circuit board disposed at a distance below said underside of said touch panel;
   a capacitive sensor element disposed between said underside of said touch panel and said printed circuit board, said capacitive sensor element being in electrically conductive contact with said printed circuit board;
   said capacitive sensor element having a compression spring formed of an electrically conductive material and a contact element formed of an electrically conductive material, said compression spring having a side facing said touch panel, said contact element being disposed on said side of said compression spring facing said touch panel, and said contact element being in electrically conductive contact with said compression spring; and
   a central holding pin being integral with said touch panel and extending through said capacitive sensor element substantially over the entire height of said capacitive sensor element.

2. The capacitive touch switch according to claim 1, wherein said holding pin has an end facing said printed circuit board and a latching device at said end facing said printed circuit board for mechanical connection to said printed circuit board.

3. The capacitive touch switch according to claim 1, wherein said capacitive sensor element has a side facing said printed circuit board and a further contact element at said side facing said printed circuit board for making electrical contact with said printed circuit board.

4. The capacitive touch switch according to claim 3, wherein said further contact element has a latching device for mechanical connection to said printed circuit board.

5. The capacitive touch switch according to claim 3, wherein said further contact element and said compression spring are interconnected by a soldered joint.

6. The capacitive touch switch according to claim 1, which further comprises a further contact element disposed on said printed circuit board for making electrical contact with said compression spring.

7. The capacitive touch switch according to claim 1, wherein said contact element and said compression spring are interconnected by a soldered joint.

8. The capacitive touch switch according to claim 1, wherein said holding pin is a fiber-optic element, and a luminous element is disposed on said printed circuit board in a central position of said capacitive sensor element.

9. The capacitive touch switch according to claim 1, which further comprises at least one luminous element disposed between said printed circuit board and said touch panel, in addition to said capacitive sensor element.

10. The capacitive touch switch according to claim 1, which further comprises a foil disposed on said upper side of said touch panel, said foil having a rear side facing said touch panel, said rear side being metal-plated in vicinity of said contact element of said capacitive sensor element.

11. A capacitive touch switch, comprising:
    a touch panel having an upper side and an underside;
    a printed circuit board disposed at a distance below said underside of said touch panel;
    a capacitive sensor element disposed between said underside of said touch panel and said printed circuit board, said capacitive sensor element being in electrically conductive contact with said printed circuit board;
    said capacitive sensor element having a compression spring formed of an electrically conductive material and a contact element formed of an electrically conductive material, said compression spring having a side facing said touch panel, said contact element being disposed on said side of said compression spring facing said touch panel, and said contact element being in electrically conductive contact with said compression spring; and
    a central holding in being formed in one-piece with said touch panel and extending through said capacitive sensor element substantially over the entire height of said capacitive sensor element.

12. The capacitive touch switch according to claim 11, wherein said holding pin has an end facing said printed circuit board and a latching device at said end facing said printed circuit board for mechanical connection to said printed circuit board.

13. The capacitive touch switch according to claim 11, wherein said capacitive sensor element has a side facing said printed circuit board and a further contact element at said side facing said printed circuit board for making electrical contact with said printed circuit board.

14. The capacitive touch switch according to claim 13, wherein said further contact element has a latching device for mechanical connection to said printed circuit board.

15. The capacitive touch switch according to claim 13, wherein said further contact element and said compression spring are interconnected by a soldered joint.

16. The capacitive touch switch according to claim 11, which further comprises a further contact element disposed on said printed circuit board for making electrical contact with said compression spring.

17. The capacitive touch switch according to claim 11, wherein said contact element and said compression spring are interconnected by a soldered joint.

18. The capacitive touch switch according to claim 11, wherein said holding pin is a fiber-optic element, and a luminous element is disposed on said printed circuit board in a central position of said capacitive sensor element.

19. The capacitive touch switch according to claim 11, which further comprises at least one luminous element disposed between said printed circuit board and said touch panel, in addition to said capacitive sensor element.

20. The capacitive touch switch according to claim 11, which further comprises a foil disposed on said upper side of said touch panel, said foil having a rear side facing said touch panel, said rear side being metal-plated in vicinity of said contact element of said capacitive sensor element.

* * * * *